(12) United States Patent
Nagasaki et al.

(10) Patent No.: US 10,861,688 B2
(45) Date of Patent: Dec. 8, 2020

(54) ELECTRON BEAM DETECTION ELEMENT, ELECTRON MICROSCOPE, AND TRANSMISSION ELECTRON MICROSCOPE

(71) Applicant: CANON KABUSHIKI KAISHA, Tokyo (JP)

(72) Inventors: Mizuki Nagasaki, Yokohama (JP); Hidekazu Takahashi, Zama (JP)

(73) Assignee: Canon Kabushiki Kaisha, Tokyo (JP)

(*) Notice: Subject to any disclaimer, the term of this patent is extended or adjusted under 35 U.S.C. 154(b) by 34 days.

(21) Appl. No.: 16/180,923

(22) Filed: Nov. 5, 2018

(65) Prior Publication Data

US 2019/0139749 A1 May 9, 2019

(30) Foreign Application Priority Data

Nov. 7, 2017 (JP) .................................. 2017-214832

(51) Int. Cl.
| | |
|---|---|
| *H01J 49/00* | (2006.01) |
| *H01J 49/02* | (2006.01) |
| *H01J 37/244* | (2006.01) |
| *H01J 37/26* | (2006.01) |

(52) U.S. Cl.
CPC .......... *H01J 49/025* (2013.01); *H01J 37/244* (2013.01); *H01J 37/265* (2013.01); *H01J 2237/28* (2013.01)

(58) Field of Classification Search
CPC ...... H01J 49/025; H01J 37/265; H01J 37/244; H01J 2237/28; H01J 37/243
USPC .................................. 250/306, 307, 310, 311
See application file for complete search history.

(56) References Cited

U.S. PATENT DOCUMENTS

| | | | | |
|---|---|---|---|---|
| 2006/0054813 A1* | 3/2006 | Nokuo | .................. | G01N 23/225 250/307 |
| 2006/0060775 A1* | 3/2006 | Sakakibara | ............ | B82Y 10/00 250/307 |
| 2007/0023655 A1* | 2/2007 | Nishikata | .............. | H01J 37/228 250/310 |
| 2012/0025074 A1* | 2/2012 | Barbi | .................. | G01N 23/2257 250/307 |
| 2012/0112062 A1* | 5/2012 | Novak | .................... | H01J 37/18 250/307 |
| 2012/0205539 A1* | 8/2012 | Hlavenka | .............. | H01J 37/244 250/307 |
| 2013/0015331 A1* | 1/2013 | Birk | .......................... | G01J 3/36 250/208.2 |
| 2013/0056634 A1* | 3/2013 | Sluijterman | .......... | H01J 37/244 250/307 |
| 2016/0148782 A1* | 5/2016 | Agemura | .............. | H01J 37/244 250/310 |

(Continued)

FOREIGN PATENT DOCUMENTS

| | | |
|---|---|---|
| JP | 60-064239 A | 4/1985 |
| JP | 05-137074 A | 6/1993 |

(Continued)

*Primary Examiner* — Michael Maskell
(74) *Attorney, Agent, or Firm* — Canon U.S.A., Inc. IP Division

(57) ABSTRACT

An electron beam detection element includes a control unit configured to cause a diode to transition from an inactive state to an active state in response to a change of signal level of a control signal for causing an electron gun to change from an inactive state to an active state.

20 Claims, 13 Drawing Sheets

(56) References Cited

U.S. PATENT DOCUMENTS

2016/0178543 A1\* 6/2016 Schillinger .......... G01N 23/203
                                                                              250/307

FOREIGN PATENT DOCUMENTS

| JP | 2000-324400 A | 11/2000 |
|----|---------------|---------|
| JP | 2013-20972 A  | 1/2013  |

\* cited by examiner

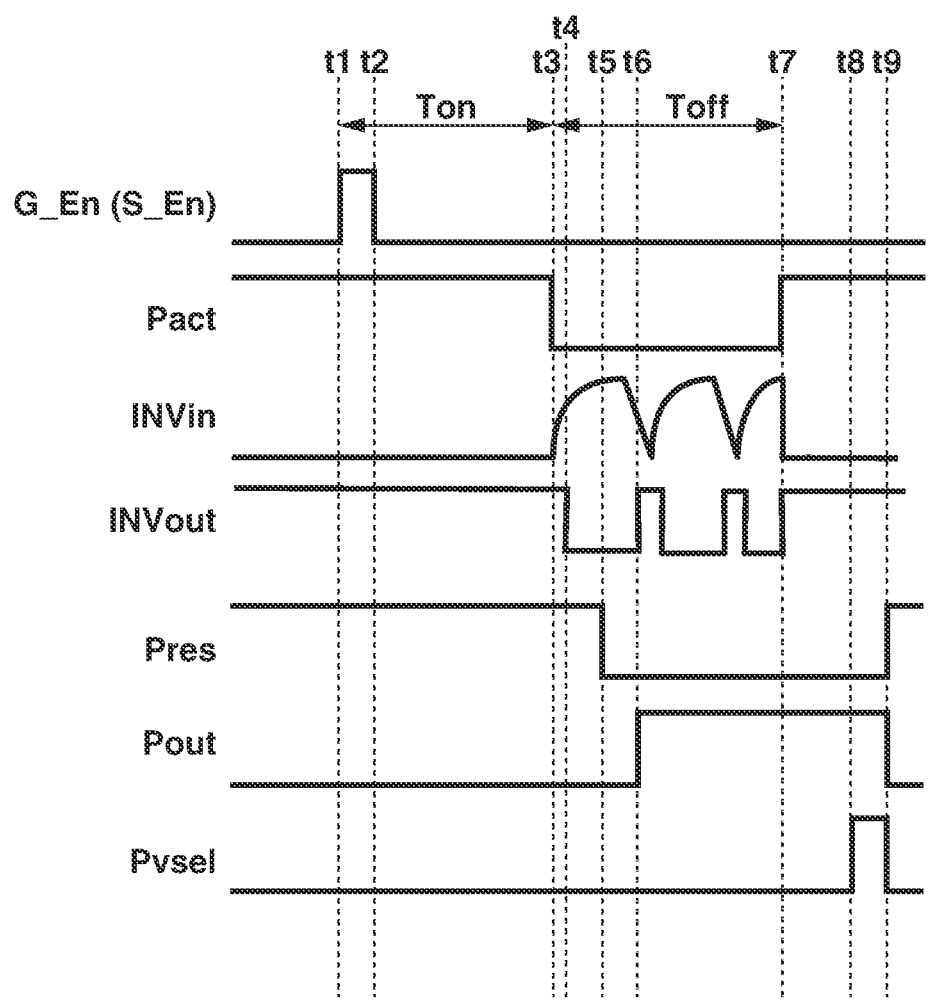

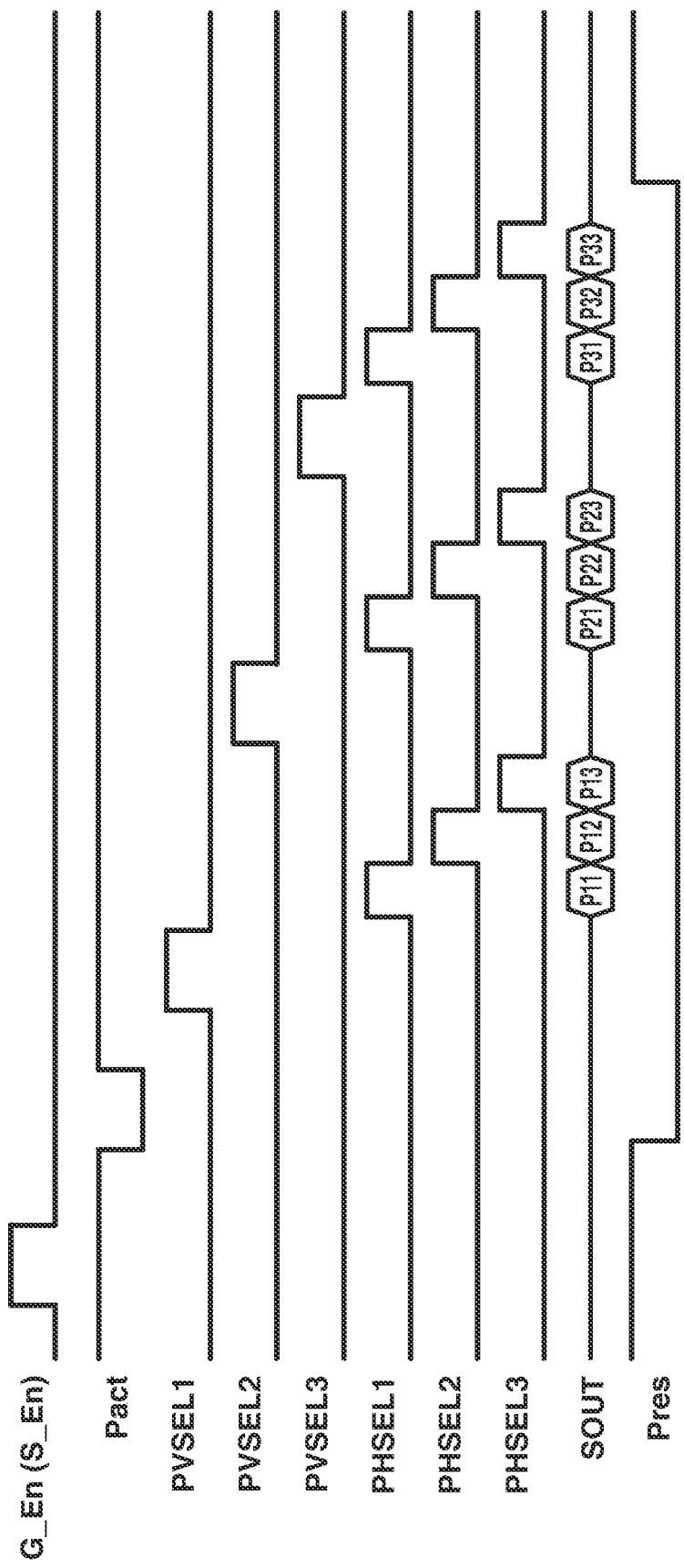

ELECTRON BEAM DETECTION ELEMENT, ELECTRON MICROSCOPE, AND TRANSMISSION ELECTRON MICROSCOPE

BACKGROUND

Field of the Disclosure

Aspects of the present disclosure generally relate to an electron beam detection element, an electron microscope, and a transmission electron microscope.

Description of the Related Art

There is known a microscope equipped with an electron beam detection element which irradiates a specimen with an electron beam radiated from an electron gun and detects electrons passing through the specimen or secondary electrons released from the specimen.

Examples of the electron beam detection element include a photodetection apparatus discussed in Japanese Patent Application Laid-Open No. 2013-20972. The photodetection apparatus discussed in Japanese Patent Application Laid-Open No. 2013-20972 makes diodes located in a range to be irradiated with an electron beam active and makes diodes located in the other range inactive. This is supposed to reduce false detection of an electronic signal caused by dark noise, which occurs in a case where diodes located in places other than the range to be irradiated with an electron beam are defective and have been made active.

SUMMARY

According to an aspect of the present disclosure, an electron beam detection element including a diode configured to detect electrons generated by an electron beam radiated from an electron gun further includes a control unit configured to cause the diode to transition from an inactive state to an active state in response to a change of signal level of a control signal for causing the electron gun to change from an inactive state to an active state.

Further features of various embodiments will become apparent from the following description of exemplary embodiments with reference to the attached drawings.

BRIEF DESCRIPTION OF THE DRAWINGS

FIG. 4 is a diagram illustrating an operation of the electron beam detection element.

FIG. 5 is a diagram illustrating an operation of the electron beam detection element.

DESCRIPTION OF THE EMBODIMENTS

The technique discussed in Japanese Patent Application Laid-Open No. 2013-20972 appears to select diodes which are made active according to whether each diode is located in a range to be irradiated with an electron beam. However, in the technique discussed in Japanese Patent Application Laid-Open No. 2013-20972, no consideration appears to be taken about an operation concerning diodes in a case where the electron gun is in an inactive state. Accordingly, any reduction in consumption current of diodes in a case where the electron gun is in an inactive state is apparently also not taken into consideration.

Various exemplary embodiments, features, and aspects will be described in detail below with reference to the drawings. Furthermore, the conductivity type of a transistor described in the exemplary embodiments described below is merely an example, and some embodiments are not limited to only the conductivity type described in the exemplary embodiments. The conductivity type described in the exemplary embodiments can be changed as appropriate, and, according to this change, the electric potentials of the gate, source, and drain of a transistor can be changed as appropriate. For example, in the case of a transistor which functions as a switch, the low level and high level of an electric potential to be supplied to the gate can be made the reverse of those described in the exemplary embodiment.

Figure 1:
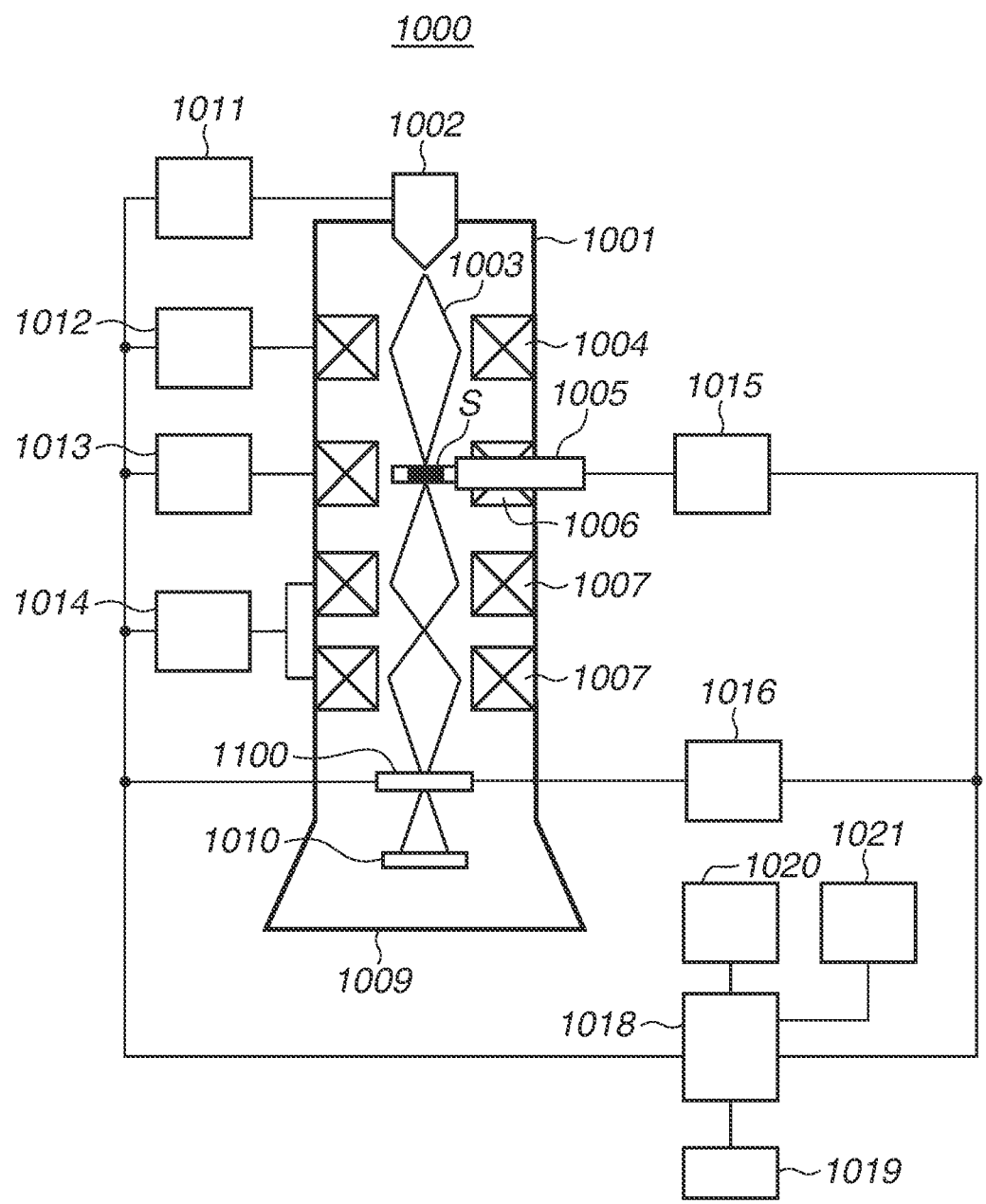
FIG. 1 is an overall view of an electron microscope.

FIG. 1 is a schematic view illustrating a configuration of a transmission electron microscope serving as an example of an electron microscope according to a first exemplary embodiment. In the configuration illustrated in the schematic view, the transmission electron microscope includes an electron beam detection element 1100. An electron beam 1003 emitted from an electron gun 1002 of the electron microscope body 1000 is converged by an irradiation lens 1004 and is then used to irradiate a specimen S held on a stage. Then, an electron beam 1003 having passed through the specimen S is magnified by an objective lens 1006 and a magnifying lens system 1007 and is then projected onto the electron beam detection element 1100. An electron optical system for irradiating the specimen S with an electron beam is referred to as an "irradiation optical system", and an electron optical system for forming an image of an electron beam having passed through the specimen S on the electron beam detection element 1100 is referred to as an "imaging optical system". To enable measuring the specimen S in a cooled state, a specimen holding table for keeping a low-temperature condition can be provided in the stage.

The electron gun 1002 is controlled by an electron gun control device 1011. The irradiation lens 1004 is controlled by an irradiation lens control device 1012. The objective lens 1006 is controlled by an objective lens control device 1013. The magnifying lens system 1007 is controlled by a magnifying lens system control device 1014. A stage control mechanism 1005 is controlled by a stage drive mechanism control device 1015.

The electron beam 1003 having passed through the specimen S is detected by the electron beam detection element

1100. An image signal is generated by a signal processing device 1016 and an image processing device 1018 based on an output signal from the electron beam detection element 1100, and the generated image signal (a transmission electron signal) is displayed on an image display monitor 1020 and an analysis monitor 1021.

The lower end portion of the electron microscope body 1000 forms a camera chamber 1009, and a fluorescent plate 1010 is provided inside the camera chamber 1009. With the electron beam detection element 1100 removed from the pathway of the electron beam 1003, a magnified image of the specimen S obtained from the electron beam 1003 can be observed on the surface of the fluorescent plate 1010.

Each of the electron gun control device 1011, the irradiation lens control device 1012, the objective lens control device 1013, the magnifying lens system control device 1014, and the stage drive mechanism control device 1015 is connected to the image processing device 1018. This enables each of the electron gun control device 1011, the irradiation lens control device 1012, the objective lens control device 1013, the magnifying lens system control device 1014, and the stage drive mechanism control device 1015 to exchange data with the image processing device 1018. This also enables the image processing device 1018 to set an image capturing condition of the electron microscope. Drive control of the stage and setting of an observation condition for each lens can be set in response to signals from the image processing device 1018. Moreover, the image processing device 1018 is connected to the electron beam detection element 1100 and controls an operation of the electron beam detection element 1100. Thus, the image processing device 1018 is a control unit which controls an operation of the electron beam detection element 1100.

The operator prepares the specimen S, which serves as an image capturing target, and sets an image capturing condition via an input device 1019, which is connected to the image processing device 1018. The operator inputs respective pieces of predetermined data to the electron gun control device 1011, the irradiation lens control device 1012, the objective lens control device 1013, and the magnifying lens system control device 1014, thus performing an operation to obtain an intended accelerating voltage, magnification, and observation mode. Moreover, the operator inputs various conditions, such as the number of continuous visual field images, an image capturing start position, and a movement speed of the stage, to the image processing device 1018 via the input device 1019. Specifications in which the image processing device 1018 automatically sets the conditions without recourse to inputting by the operator can be employed.

The electron gun control device 1011 performs control to switch between an active state (a state of radiating an electron beam) and an inactive state (a state of preventing radiation of an electron beam) of the electron gun 1002 based on a control signal output from the image processing device 1018.

Figure 2:
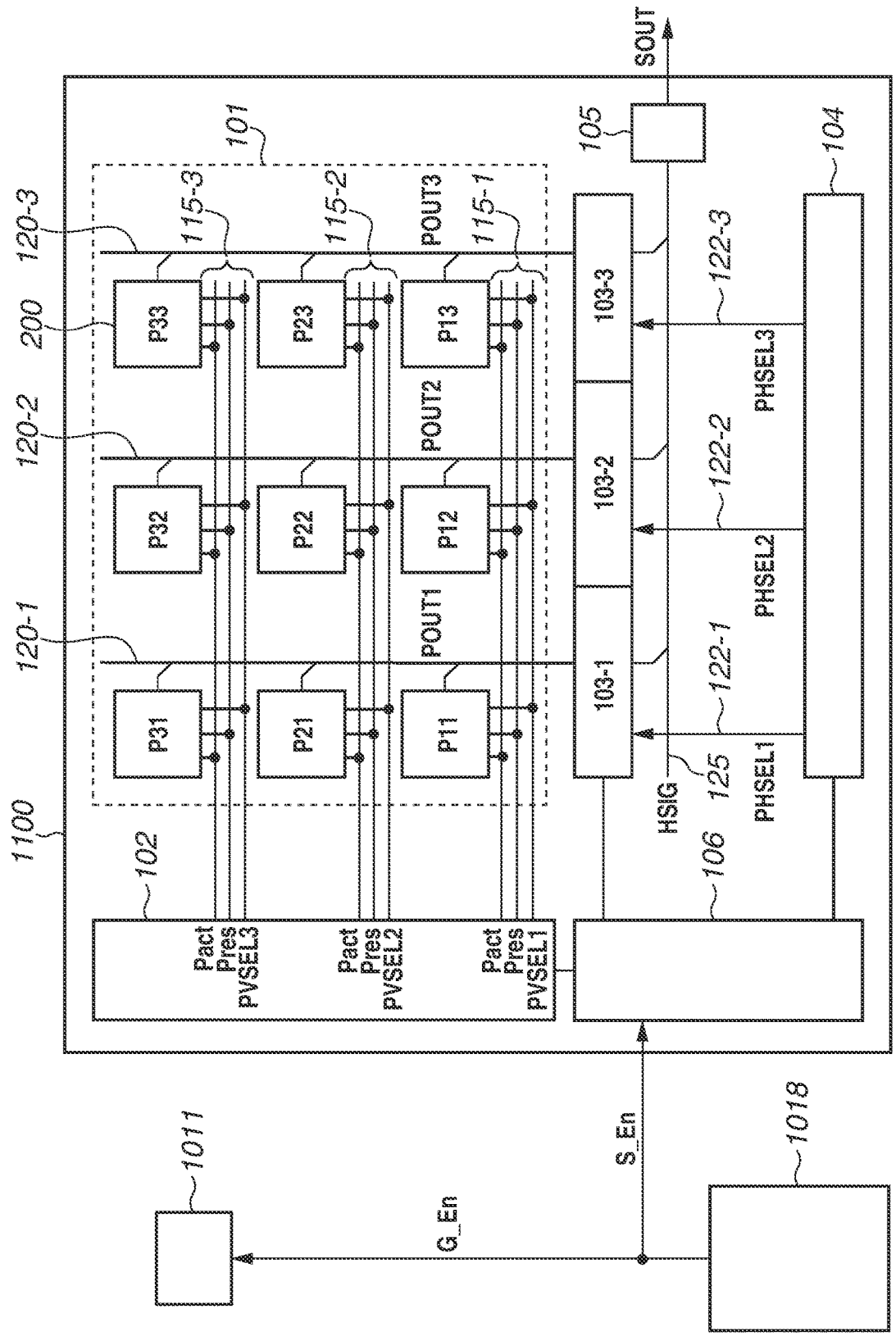
FIG. 2 is a diagram illustrating a configuration of an electron beam detection element.

FIG. 2 illustrates an overall view of the electron beam detection element 1100 illustrated in FIG. 1 together with the image processing device 1018 and the electron gun control device 1011 illustrated in FIG. 1.

The electron beam detection element 1100 includes a pixel portion 101. The pixel portion 101 has a plurality of pixels 200 arranged over a plurality of rows and a plurality of columns. In FIG. 2, the plurality of pixels 200 is represented by blocks assigned with coordinates denoted by Pmn. "m" denotes a row, and "n" denotes a column. For example, a pixel written as P31 is specified as a pixel at the third row and the first column. Furthermore, in FIG. 2, in numbering rows, a pixel row located closest to a signal holding unit 103, in which signals from the pixel portion 101 are held, is assumed to be the first row, and the row number increases as a pixel row is farther away from the signal holding unit 103. Moreover, in numbering columns of the pixel portion 101, a pixel column located closest to a vertical scanning unit 102, which scans the pixel portion 101, is assumed to be the first column, and the column number increases as a pixel column is farther away from the vertical scanning unit 102.

The pixel portion 101 has control lines 115-$m$ (m being the row number) arranged in association with the respective rows of the pixels 200.

The electron beam detection element 1100 includes the vertical scanning unit 102. The vertical scanning unit 102 scans the pixels 200 on a row by row basis. The vertical scanning unit 102 outputs a signal Pact, a signal Pres, and a signal PVSELm (m being the row number) to pixels 200 of each row via a corresponding control line 115-$m$.

Signal lines 120-$n$ (n being the column number) are arranged in association with the respective columns of the pixels 200. Pixels 200 in one column are connected to one signal line 120-$n$. The pixels 200 sequentially output signals to the signal line 120-$n$ according to scanning performed by the vertical scanning unit 102.

Signal holding units 103-$n$ (n being the column number) are arranged in association with the respective columns of the signal lines 120-$n$. Each of the signal holding units 103-$n$ holds signals output to the corresponding signal line 120-$n$.

A horizontal scanning unit 104 is connected to the signal holding units 103-$n$ via control lines 122-$n$ (n being the column number). The control lines 122-$n$ transfer signals PHSELn (n being the column number) output from the horizontal scanning unit 104 to the signal holding units 103-$n$.

A signal which has been held by a signal holding unit 103-$n$ to which an active signal PHSELn has been input is output as a signal HSIG from the signal holding unit 103-$n$ to an output unit 105 via a signal line 125. The output unit 105 performs signal processing (for example, correlated double sampling (CDS) processing and correction processing) on the signal HSIG output from the signal line 125 and outputs the processed signal to the outside of the electron beam detection element 1100.

The electron beam detection element 1100 further includes an element control unit 106. The element control unit 106 controls the vertical scanning unit 102, the signal holding units 103-$n$, and the horizontal scanning unit 104. Moreover, the element control unit 106 also serves as a control unit configured to perform switching between an active state and an inactive state of pixels 200.

To the element control unit 106, a control signal S_En for controlling the electron beam detection element 1100 is input from the image processing device 1018, which is outside the electron beam detection element 1100. This control signal corresponds to a control signal G_En for the electron gun 1002, which is output from the image processing device 1018 to the electron gun control device 1011. Specifically, the control signal G_En is a signal indicating timing to change the electron gun 1002 from an inactive state to an active state. On the other hand, the control signal S_En for controlling the electron beam detection element 1100 is a signal indicating timing at which the pixel 200 changes from an inactive state to an active state, which is timing corresponding to the timing to change the electron gun 1002 from an inactive state to an active state.

Figure 3A:
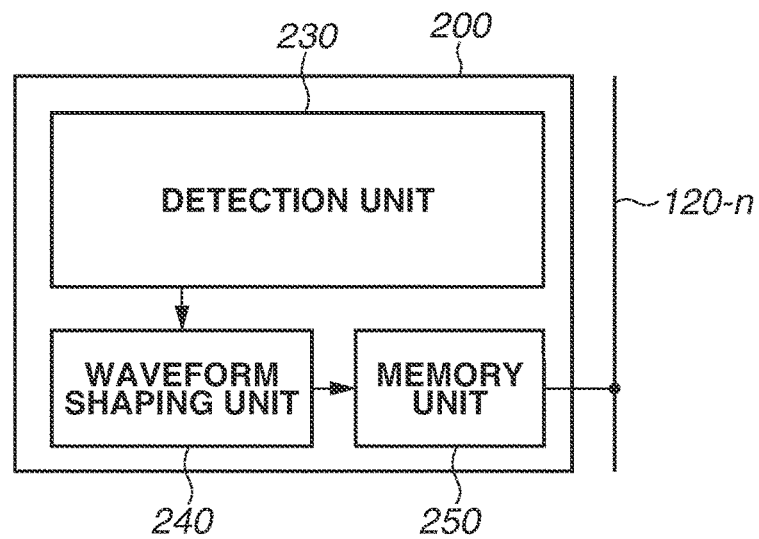
FIGS. 3A and 3B are a diagram illustrating a configuration of a pixel and a diagram illustrating an equivalent circuit of the pixel, respectively.
Figure 3B:
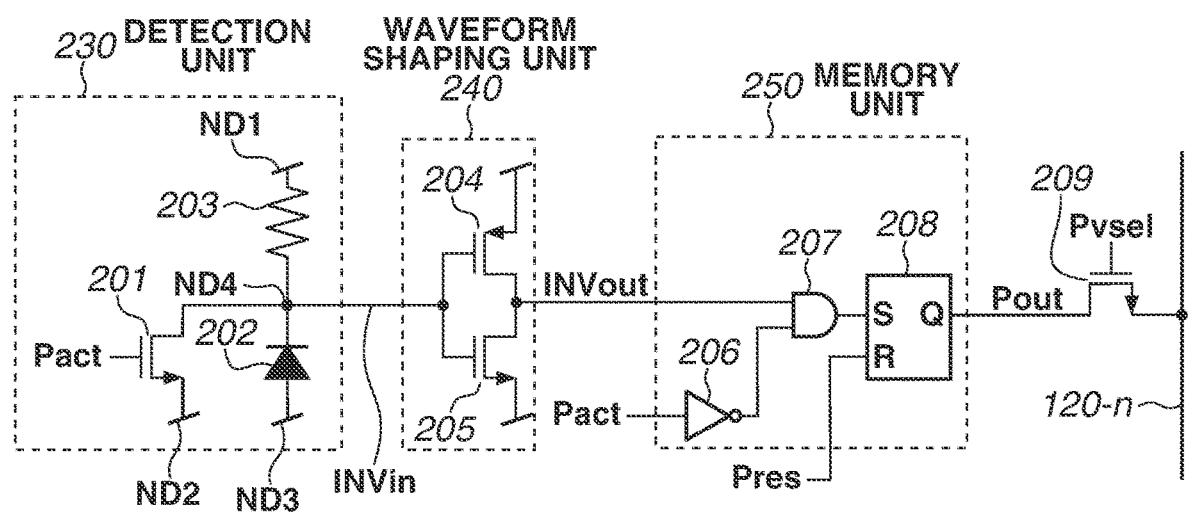

FIGS. 3A and 3B are diagrams illustrating a configuration of each pixel 200 illustrated in FIG. 2. FIG. 3A is a schematic view of the pixel 200.

The pixel 200 includes a detection unit 230, a waveform shaping unit 240, and a memory unit 250. The output of the memory unit 250 is output to the signal line 120-*n*.

FIG. 3B is a diagram illustrating an equivalent circuit of the pixel 200 illustrated in FIG. 3A.

The detection unit 230 includes a metal-oxide semiconductor (MOS) transistor 201 functioning as a switch, an avalanche amplification-type diode 202, and a quench resistor element 203. Furthermore, in FIG. 3B, the conductivity type of each MOS transistor is also illustrated. The MOS transistor 201 is an N-channel MOS transistor.

The quench resistor element 203 is connected to a node ND1, to which a voltage VDD, being a power-supply voltage, is input. Moreover, the MOS transistor 201 is connected to a node ND2, to which a voltage GND, being a second power-supply voltage, is input. Moreover, the diode 202 is connected to a node ND3, to which the voltage GND being the second power-supply voltage is input. The nodes ND2 and ND3 can be connected to the same wiring line which transfers the voltage GND.

Moreover, the MOS transistor 201, the diode 202, and the quench resistor element 203 are connected to a node ND4.

The signal Pact, which is output from the vertical scanning unit 102, is input to a gate, serving as a control node, of the MOS transistor 201.

The output of the detection unit 230 is input to the waveform shaping unit 240 as a signal INVin.

The waveform shaping unit 240 includes MOS transistors 204 and 205. The MOS transistors 204 and 205 form an inverter circuit. This inverter circuit functions as a waveform shaping circuit which shapes the waveform of the signal INVin. The waveform shaping unit 240 outputs a signal INVout, which is a signal obtained by inverting the signal output from the node ND4, to the memory unit 250.

The memory unit 250 includes an inverter circuit 206, an AND circuit 207, and a set-reset (SR) latch circuit 208. The inverter circuit 206, to which the signal Pact output from the vertical scanning unit 102 is input, outputs a signal obtained by inverting the signal Pact to the AND circuit 207.

The AND circuit 207 outputs a signal which is the logical product of the signal INVout and the output of the inverter circuit 206 to the S terminal of the SR latch circuit 208.

The signal Pres output from the vertical scanning unit 102 is input to the R terminal of the SR latch circuit 208. A signal corresponding to the signal output from the detection unit 230 is output as a signal Pout from the Q terminal of the SR latch circuit 208 to a MOS transistor 209. The signal Pout, which is output from the SR latch circuit 208, is a one-bit digital signal. The signal Pout is a signal indicating whether electrons have fallen on the diode 202. In other words, whether electrons have fallen on the diode 202 of the pixel 200 from which the signal Pout has been output can be identified according to the signal level of the signal Pout.

A signal Pvsel is input from the vertical scanning unit 102 to a gate, serving as a control gate, of the MOS transistor 209.

FIG. 4 is a diagram illustrating an operation of the transmission electron microscope illustrated in FIG. 2 and FIGS. 3A and 3B. The following description is also made with reference to the members described in FIG. 2 and FIGS. 3A and 3B as appropriate.

In the present exemplary embodiment, the control signal G_En and the control signal S_En illustrated in FIG. 2 are assumed to be one signal used in common.

The image processing device 1018 renders the signal G_En at high level (hereinafter referred to as "H level") at time t1, and renders the signal G_En at low level (hereinafter referred to as "L level") at time t2. In response to the signal G_En becoming at H level at time t1, the electron gun 1002, which has entered an active state, starts radiation of an electron beam.

Moreover, the control signal S_En is input to the element control unit 106.

At time t3 when a predetermined period Ton has elapsed after transition of the signal S_En to H level at time t1, the vertical scanning unit 102 changes the signal Pact from H level to L level. Referring to FIG. 3B, during a period in which the signal Pact is at H level, the MOS transistor 201 is kept turned on. An electrical pathway leading from the node ND1 to the node ND2 via the quench resistor element 203, the node ND4, and the MOS transistor 201 serves as a current pathway in which a current flows. Accordingly, no current flows through the diode 202, so that the diode 202 is in an inactive state.

On the other hand, in a case where the signal Pact is at L level, the MOS transistor 201 is kept turned off. Accordingly, an electrical pathway leading from the node ND1 to the node ND3 via the quench resistor element 203, the node ND4, and the diode 202 serves as a current pathway in which a current flows. Accordingly, a current flows through the diode 202, so that the diode 202 is in an active state.

In other words, the current pathway in which a current flows when the signal Pact is at H level can be said to be a pathway that bypasses the current pathway in which a current flows when the signal Pact is at L level.

After that, in a period from time t3 to time t7, electrons of an electron beam having passed through the specimen S are assumed to fall on the diode 202 of a given pixel 200. The electrons falling on the diode 202 cause electrons to be generated at the diode 202. The electrons being generated at the diode 202 cause the signal level of the signal INVin to change from L level to H level.

In response to such a change of the signal INVin, the signal level of the signal INVout also changes. Moreover, the signal level of the signal Pout changes to H level.

At time t7, the vertical scanning unit 102 renders the signal Pact at H level again. This brings the diode 202 into an inactive state again.

After that, at time t8, the vertical scanning unit 102 renders the signal Pvsel at H level. This causes the signal Pout to be output to the corresponding signal line 120-*n*. After that, the vertical scanning unit 102 renders the signal Pres at H level with respect to the pixel row from which outputting of the signal Pout has ended, and then resets the signal Pout.

In the present exemplary embodiment, a predetermined period Ton from when the signal G_En rises to H level at time t1 to when the signal Pact is rendered at L level at time t3 is provided. The predetermined period Ton corresponds to a time taken for an electron beam radiated from the electron gun 1002 entering an active state to arrive at the electron beam detection element 1100 from the electron gun 1002 via the specimen S. Specifically, the following formulae can be considered.

$$v = \sqrt{\frac{2qV}{m}} \quad (1)$$

In formula (1), V denotes accelerating voltage (V), q denotes elementary charge (C), m denotes electron mass (kg), and v denotes velocity (m/sec).

A period Tarv (sec) required for electrons radiated from the electron gun 1002 to arrive at the electron beam detection element 1100 from the electron gun 1002 is expressed by the following formula (2).

$$Tarv = \frac{L}{v} \qquad (2)$$

In formula (2), L denotes a route distance (m) taken by electrons radiated from the electron gun 1002 to arrive at the electron beam detection element 1100 from the electron gun 1002. The velocity v can be obtained by formula (1).

Accordingly, the period Ton can be set to a value equal to or less than the period Tarv expressed by formula (2).

Furthermore, while, in the present exemplary embodiment, a predetermined period Ton from when the signal G_En changes to H level at time t1 to when the signal Pact is rendered at L level at time t3 is provided, the present exemplary embodiment is not limited to this example. For another example, a configuration in which the diode 202 transitions from an inactive state to an active state in synchronization with the signal G_En changing to H level (in other words, the electron gun 1002 transitioning from an inactive state to an active state) can be employed.

Moreover, the length of a period during which the signal Pact is at L level (in other words, a period during which the diode 202 is in an active state) can be set, for example, in the following way. The length of a period during which the diode 202 is in an active state can be set to a length equal to or larger than the period required for electrons generated at a portion deeper than the diode 202 by incoming radiation of an electron beam to flow into the diode 202. This enables appropriately detecting an electron beam falling on the corresponding pixel 200.

FIG. 5 is a diagram illustrating an operation of the pixel portion 101 of the electron beam detection element 1100 according to the present exemplary embodiment. Various signals illustrated in FIG. 5 correspond to the respective signals illustrated in FIG. 2. In the timing chart illustrated in FIG. 5, the signal Pact and the signal Pres are assumed to be signals which are used in common with respect to pixels 200 in all of the rows. In the signal SOUT, addresses of pixels 200 associated with respective signal portions thereof are additionally written.

The electron beam detection element according to the present exemplary embodiment causes a diode to transition from an inactive state to an active state in response to a change of signal level of a control signal for causing the electron gun 1002 to transition from an inactive state to an active state. This enables the electron beam detection element to reduce the consumption current of the diode when the electron gun is in an inactive state.

An electron beam detection element according to a second exemplary embodiment is described mainly about differences from the first exemplary embodiment. The electron beam detection element according to the second exemplary embodiment differs from that of the first exemplary embodiment in a circuit related to a switch which switches the diode 202 between an active state and an inactive state.

Figure 6:
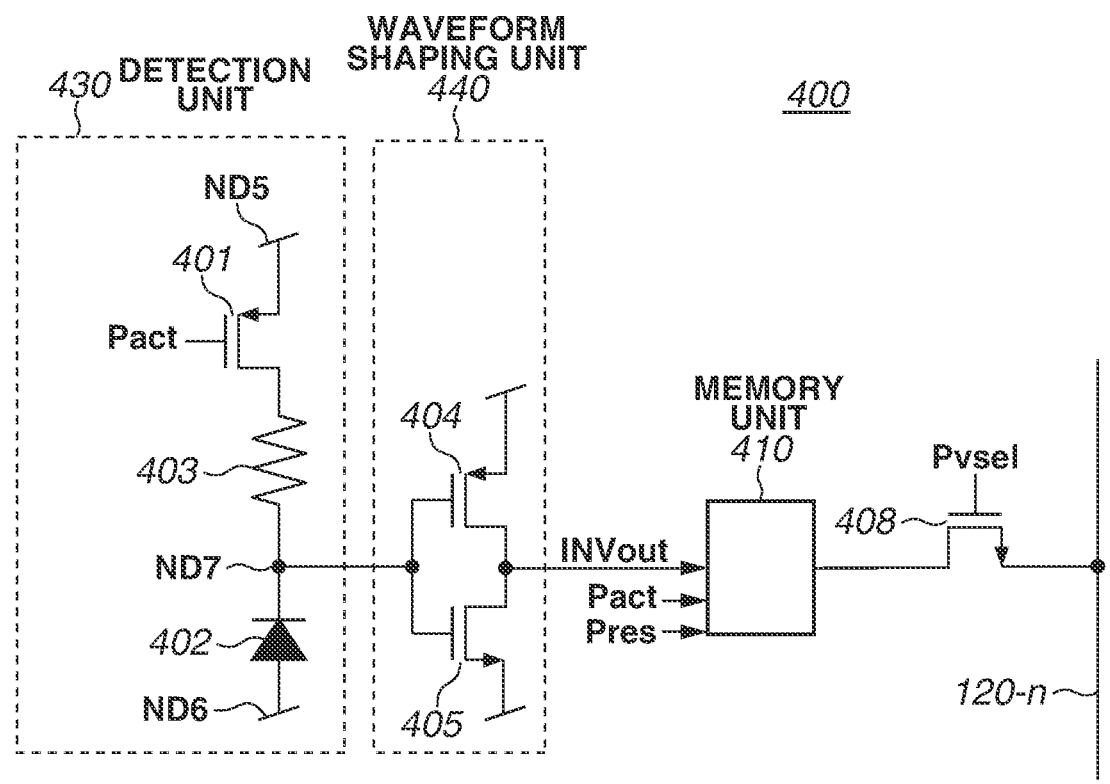
FIG. 6 is a diagram illustrating a configuration of a pixel.

FIG. 6 is a diagram illustrating a configuration of each pixel 400 of the electron beam detection element in the second exemplary embodiment. Furthermore, the electron beam detection element in the second exemplary embodiment can be configured to include pixels 400 illustrated in FIG. 6 instead of the pixels 200 of the electron beam detection element 1100 illustrated in FIG. 2. The other configuration of the electron beam detection element in the second exemplary embodiment can be configured to be the same as that of the electron beam detection element 1100 illustrated in FIG. 2.

The pixel 400 illustrated in FIG. 6 includes a memory unit 410, a detection unit 430, and a waveform shaping unit 440. The configuration of the memory unit 410 can be configured to be the same as that of the memory unit 250 illustrated in FIG. 3B.

The configuration of the waveform shaping unit 440 is configured to be the same as that of the waveform shaping unit 240 illustrated in FIG. 3B.

The detection unit 430 includes a MOS transistor 401 serving as a switch, a diode 402, and a quench resistor element 403. In FIG. 6, the MOS transistor 401 is assumed to be a P-channel MOS transistor. The MOS transistor 401 is connected to a node ND5, to which a voltage VDD serving as a power-supply voltage is input, and the quench resistor element 403. A signal Pact is input to a gate, serving as a control node, of the MOS transistor 401.

The diode 402 is connected to a node ND6, to which a voltage GND serving as a second power-supply voltage is input. Moreover, the diode 402 is connected to the quench resistor element 403 and the waveform shaping unit 440 via a node ND7.

The operation of the electron beam detection element including pixels 400 illustrated in FIG. 6 can be configured to be the same as the operation illustrated in FIG. 4.

In a case where the signal Pact is at H level, the MOS transistor 401, which is a P-channel MOS transistor, is in an off state. Accordingly, during a period in which the signal Pact is at H level, the diode 402 is in an inactive state. On the other hand, in a case where the signal Pact is at L level, the MOS transistor 401, which is a P-channel MOS transistor, is in an on state. Accordingly, during a period in which the signal Pact is at L level, the diode 402 is in an active state.

With this, the electron beam detection element in the second exemplary embodiment is also able to attain the same advantageous effect as that of the first exemplary embodiment. Moreover, in the electron beam detection element in the first exemplary embodiment, during a period in which the diode is in an inactive state, there is a consumption current caused by a current flowing in the bypass pathway. On the other hand, in the case of the second exemplary embodiment, since, during a period in which the diode 402 is in an inactive state, a current flowing from the node ND5 to the node ND6 can be prevented or reduced, the effect of reducing the amount of consumption current as compared with the electron beam detection element in the first exemplary embodiment can be attained.

Moreover, in the first exemplary embodiment, in a case where a switch for switching the operational state of the diode 202 is in an on state, the diode is in an inactive state. Then, in a case where the switch for switching the operational state of the diode 202 is in an off state, the diode is in an active state. On the other hand, in the second exemplary embodiment, in a case where a switch for switching the operational state of the diode 402 is in an off state, the diode is in an inactive state. Then, in a case where the switch for switching the operational state of the diode 402 is in an on state, the diode is in an active state. Accordingly, with reference to the first exemplary embodiment and the second exemplary embodiment, it is made clear that the switch taking one of on and off states causes the diode to be in one of an inactive state and an active state and, then, the switch taking the other of on and off states causes the diode to be in the other of an inactive state and an active state.

A third exemplary embodiment is described mainly about differences from the second exemplary embodiment.

Figure 7:
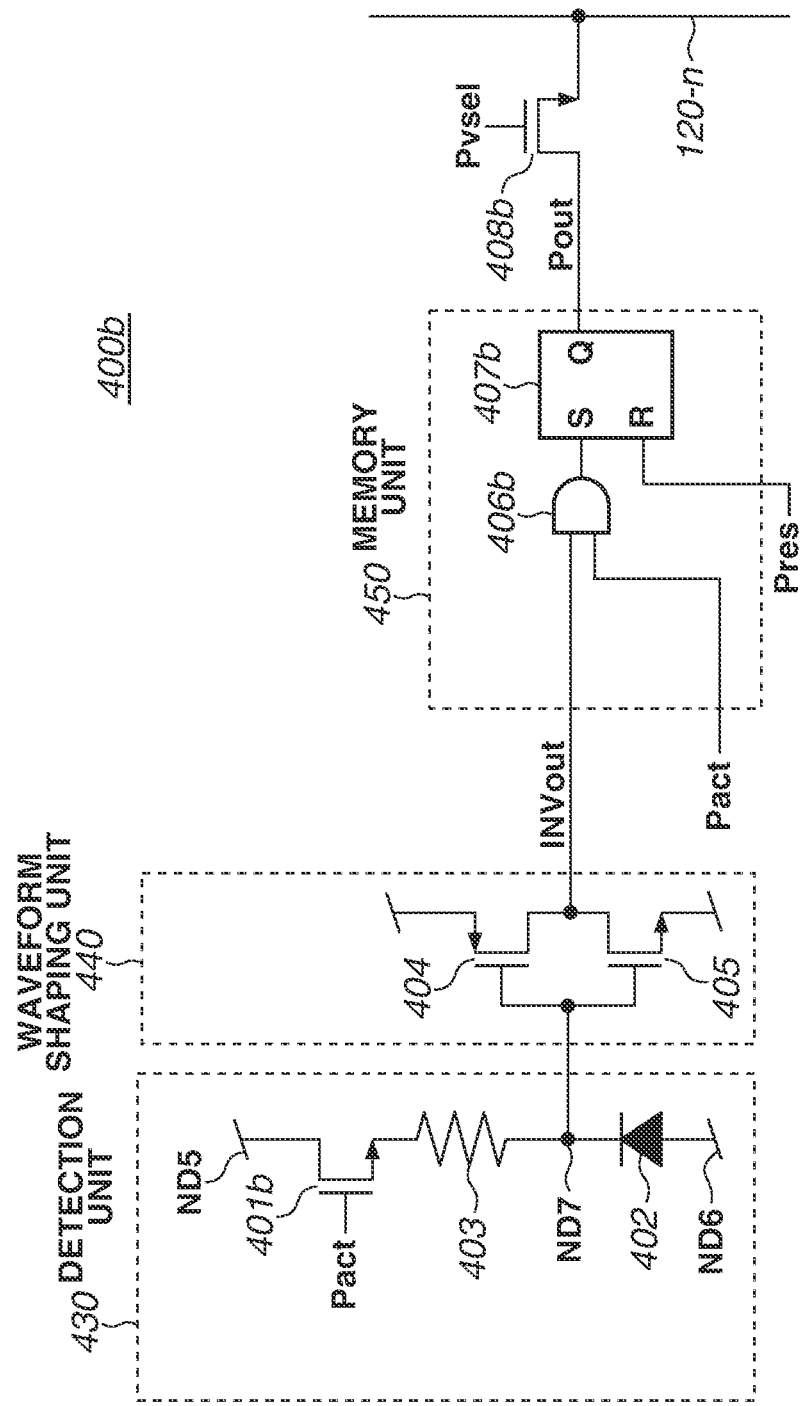
FIG. 7 is a diagram illustrating an equivalent circuit of the pixel.

FIG. 7 is a diagram illustrating a configuration of each pixel 400*b* in the third exemplary embodiment. In FIG. 7, the same members as the members included in the pixel 400 illustrated in FIG. 6 are assigned the respective same reference numerals as the reference numerals illustrated in FIG. 6. In the pixel 400*b* in the third exemplary embodiment, a MOS transistor 401*b* serving as a switch is assumed to be an N-channel MOS transistor.

The pixel 400*b* in the third exemplary embodiment includes a memory unit 450. The memory unit 250 illustrated in FIGS. 3A and 3B includes the inverter circuit 206, which outputs a signal obtained by inverting the signal Pact. On the other hand, the memory unit 450 in the third exemplary embodiment has a configuration in which the signal Pact is input to an AND circuit 406*b* without using the inverter circuit 206, which is provided in the case of the memory unit 250 illustrated in FIGS. 3A and 3B. This is because, since an N-channel MOS transistor is used as the MOS transistor 401*b*, a signal which is input to the gate of the MOS transistor 401*b* and a signal which is input to the AND circuit 406*b* can be set to the same phase.

Figure 8:
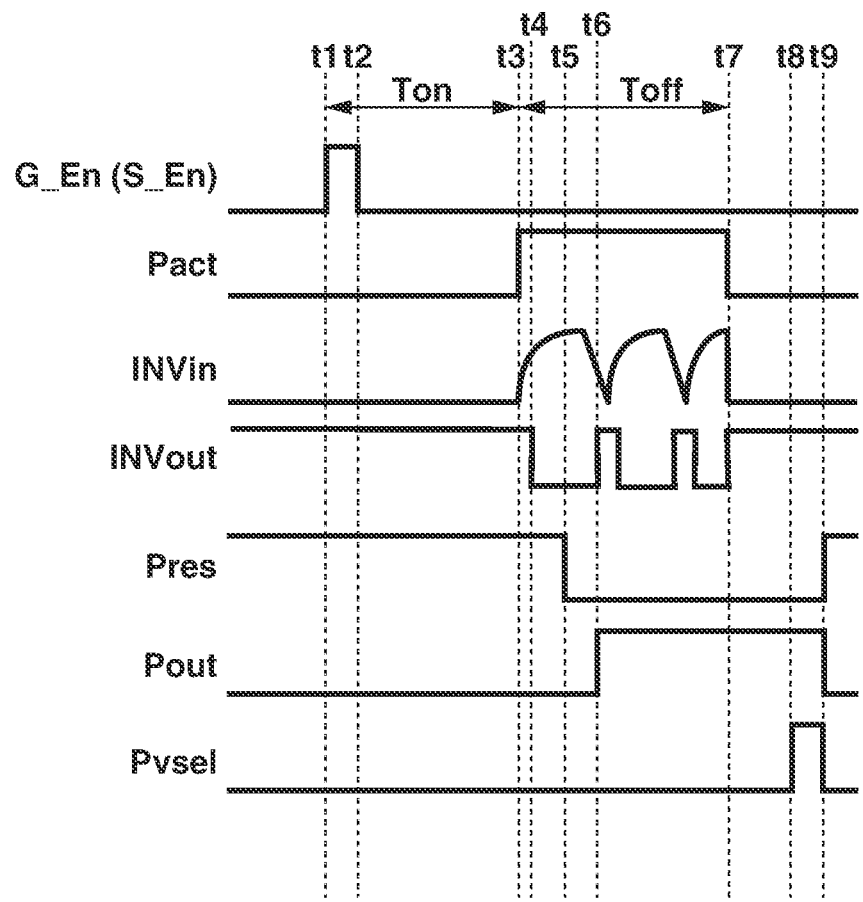
FIG. 8 is a diagram illustrating an operation of the electron beam detection element.

FIG. 8 is a diagram illustrating an operation of an electron beam detection element including pixels 400*b* illustrated in FIG. 7.

A difference from the timing chart of FIG. 4 is that a signal Pact illustrated in FIG. 8 is a signal obtained by inverting the signal Pact illustrated in FIG. 4 with respect to L level and H level. The other signals illustrated in FIG. 8 are the same as the signals illustrated in the timing chart of FIG. 4.

In a period before time t3, the signal level of the signal Pact is L level. With this, in a period before time t3, the MOS transistor 401*b* is in an off state. Therefore, the diode 402 is in an inactive state. Moreover, the signal Pact which is at L level is also input to the AND circuit 406*b* of the memory unit 450. Therefore, the output of the AND circuit 406*b* is also at L level.

Even in the third exemplary embodiment, the same advantageous effect as that in the electron beam detection element in the second exemplary embodiment can be attained. Moreover, the electron beam detection element in the third exemplary embodiment has the advantageous effect of being able to reduce the circuit area thereof as the inverter circuit 206 can be omitted from the configurations of the first and second exemplary embodiments.

An electron beam detection element according to a fourth exemplary embodiment is described mainly about differences from the first exemplary embodiment.

In the first exemplary embodiment, the pixel 200 includes the avalanche amplification-type diode 202. The fourth exemplary embodiment differs from the first exemplary embodiment in that each pixel includes a charge accumulation-type diode.

Figure 9:
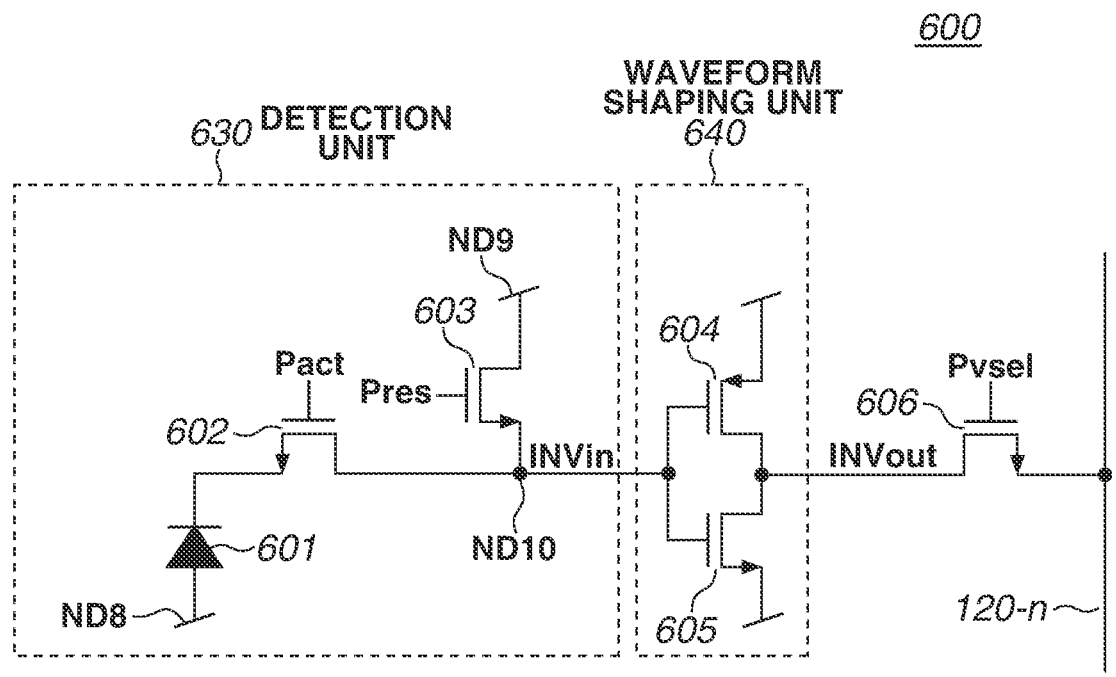
FIG. 9 is a diagram illustrating an equivalent circuit of the pixel.

FIG. 9 is an equivalent circuit diagram of each pixel 600 included in the electron beam detection element in the fourth exemplary embodiment. Furthermore, the configuration of the electron beam detection element is assumed to be a configuration in which pixels 600 are provided instead of the pixels 200 with respect to the configuration illustrated in FIG. 2. The configuration of the other portions of the electron beam detection element can be set to the same as the configuration illustrated in FIG. 2.

The pixel 600 includes a detection unit 630 and a waveform shaping unit 640. The detection unit 630 includes a diode 601, a MOS transistor 602, and a MOS transistor 603. The diode 601 is connected to a node ND8, to which a voltage GND serving as a second power-supply voltage is input. Moreover, the diode 601 is a charge accumulation-type diode, which accumulates electrons generated by incoming radiation of an electron beam.

Each of the MOS transistors 602 and 603 is an N-channel MOS transistor. The MOS transistor 603 is connected to a node ND9, to which a voltage VDD serving as a power-supply voltage is input. Moreover, the signal Pres is input to a gate, serving as a control node, of the MOS transistor 603.

The MOS transistor 603 is connected to the MOS transistor 602 via a node ND10. Moreover, the node ND10 is connected to the waveform shaping unit 640. A signal output to the node ND10 is output as a signal INVin to the waveform shaping unit 640.

The output of the waveform shaping unit 640 is output as a signal INVout to a MOS transistor 606. The signal Pvsel is input to a gate, serving as a control node, of the MOS transistor 606. In a case where the signal Pvsel is at H level, the signal INVout is output to a signal line 120-*n* corresponding to the pixel 600.

Figure 10:
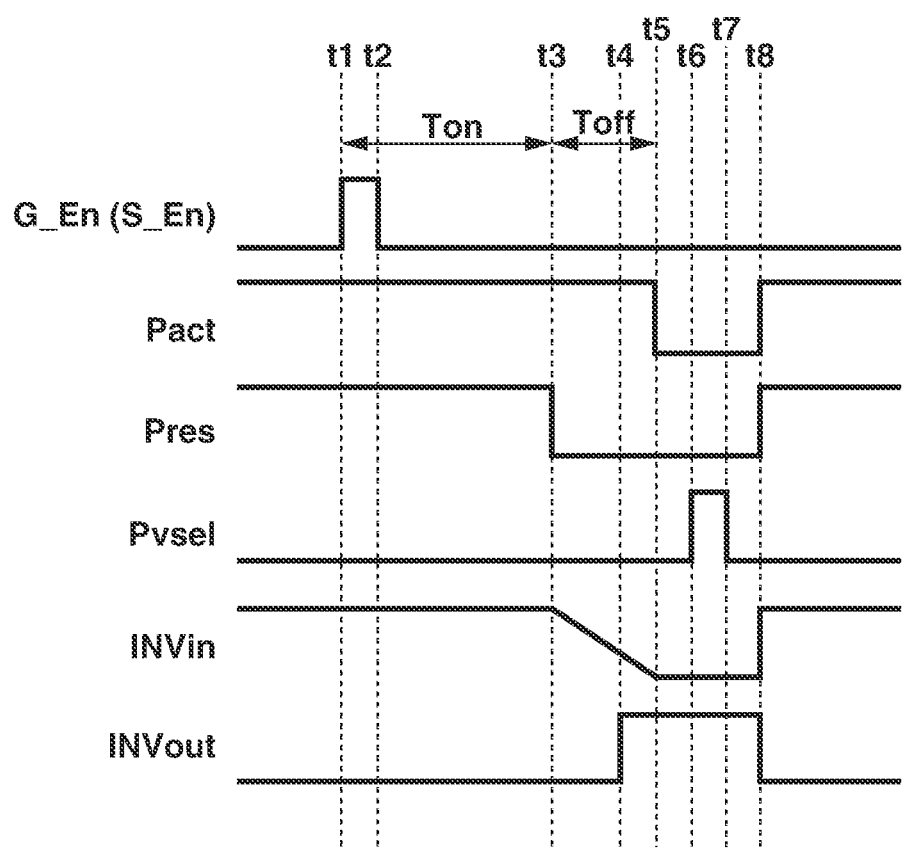
FIG. 10 is a diagram illustrating an operation of the electron beam detection element.

FIG. 10 is a diagram illustrating an operation of the electron beam detection element including pixels 600 illustrated in FIG. 9.

Before time t1, the vertical scanning unit 102 renders both the signal Pact and the signal Pres at H level. With this, the MOS transistors 602 and 603 enter an on state. Therefore, each of the node ND10 and the diode 601 is previously reset to a voltage corresponding to the voltage VDD of the node ND9. Here, the state in which the diode 601 is previously reset is an inactive state of the diode 601.

The image processing device 1018 renders the signal G_En at H level at time t1, and renders the signal G_En at L level at time t2. In response to the signal G_En changing to H level at time t1, the electron gun 1002, which has entered an active state, starts radiation of an electron beam.

Moreover, the control signal S_En is input to the element control unit 106.

At time t3 when a predetermined period Ton has elapsed after transition of the signal S_En to H level at time t1, the vertical scanning unit 102 changes the signal Pres from H level to L level. With this, resetting of the node ND10 and the diode 601 is canceled. This changes the diode 601 from an inactive state to an active state.

Electrons of the diode 601 obtained by incoming radiation of an electron beam to the diode 601 are transferred to the node ND10 via the MOS transistor 602. With this, the signal level of the signal INVin becomes low.

At time t4, the signal amplitude of the signal INVin exceeds a threshold value at which the output of the waveform shaping unit 640 is inverted. With this, the signal level of the signal INVout changes from L level to H level.

At time t5, the vertical scanning unit 102 renders the signal Pact at L level. With this, the MOS transistor 602 enters an inactive state, so that the electrical pathway between the diode 601 and the node ND10 becomes non-conductive.

At time t6, the vertical scanning unit 102 changes the signal Pvsel from L level to H level. With this, the signal INVout is output to a signal line 120-*n* corresponding to the pixel 600.

At time t7, the vertical scanning unit 102 changes the signal Pvsel from H level to L level. After that, the vertical scanning unit 102 performs the same operation as that illustrated in FIG. 10 on the other pixel rows.

Even in the fourth exemplary embodiment, during a period in which the electron gun 1002 is in an inactive state, the diode 601 is kept in an inactive state. Then, at timing that is based on a timing at which the electron gun 1002 transitions from an inactive state to an active state, the vertical scanning unit 102 causes the diode 601 to transition from an inactive state to an active state. With this, the electron beam detection element in the fourth exemplary embodiment including charge accumulation-type diodes can attain the same advantageous effect as that in the first exemplary embodiment.

An electron beam detection element according to a fifth exemplary embodiment is described focusing mainly on differences from the first exemplary embodiment.

In the electron beam detection element in the first exemplary embodiment, a timing at which to cause the diode 202 to transition from an inactive state to an active state is set to the time after a previously-set predetermined period Ton elapses. In the fifth exemplary embodiment, in a period in which the electron gun 1002 is in an inactive state, some pixels of a plurality of pixels are brought into an active state. Then, when the electron gun 1002 enters an active state and the signal outputs of some such pixels change, the other pixels transition from an inactive state to an active state. In other words, the fifth exemplary embodiment is an embodiment in which, to detect timing at which to cause the other pixels to transition from an inactive state to an active state, some pixels are used as monitor pixels for monitoring the state of the electron gun 1002.

Figure 11:
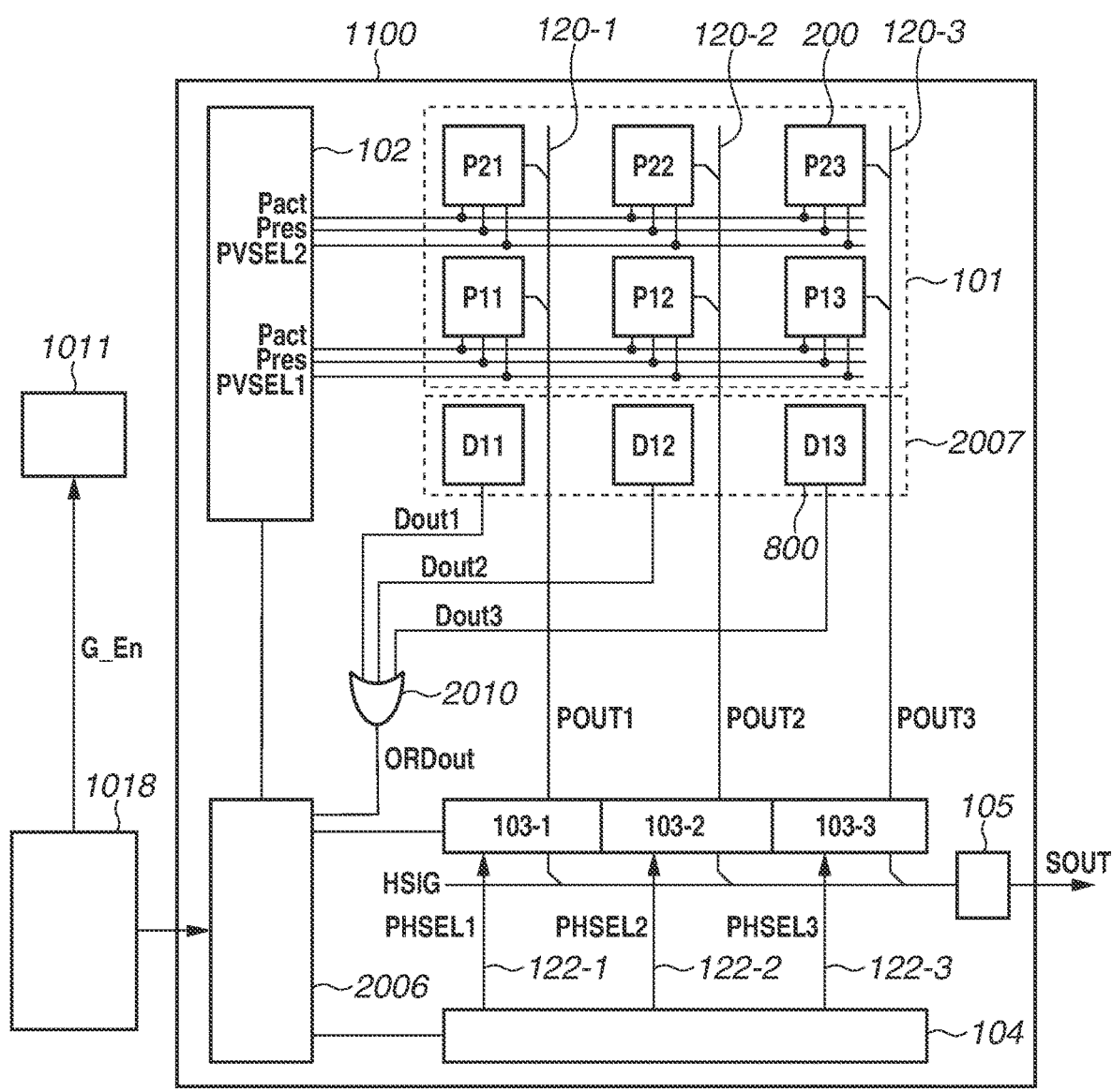
FIG. 11 is a diagram illustrating a configuration of an electron beam detection element.

FIG. 11 is a diagram illustrating a configuration of the electron beam detection element 1100 according to the fifth exemplary embodiment together with an electron gun control device 1011 and an image processing device 1018. In FIG. 11, members having the same functions as those of the members illustrated in FIG. 2 are assigned the respective same reference numerals as the reference numerals illustrated in FIG. 2.

The electron beam detection element 1100 illustrated in FIG. 11 includes monitor pixels 800. Signals Dout1 to Dout3, which the respective monitor pixels 800 output, are input to an OR circuit 2010. The OR circuit 2010 outputs a signal ORDout, which is generated by the logical product of the signals Dout1 to Dout3, to an element control unit 2006. The element control unit 2006 outputs a control signal for switching between an inactive state and an active state of the diode 202 to the vertical scanning unit 102.

While, in the configuration of the transmission electron microscope illustrated in FIG. 2, the control signal S_En is input from the image processing device 1018 to the element control unit 106, inputting of the control signal S_En to the electron beam detection element 1100 is omitted in the fifth exemplary embodiment. In the fifth exemplary embodiment, other control signals (for example, a clock signal) are input from the image processing device 1018 to the element control unit 2006.

Figure 12A:
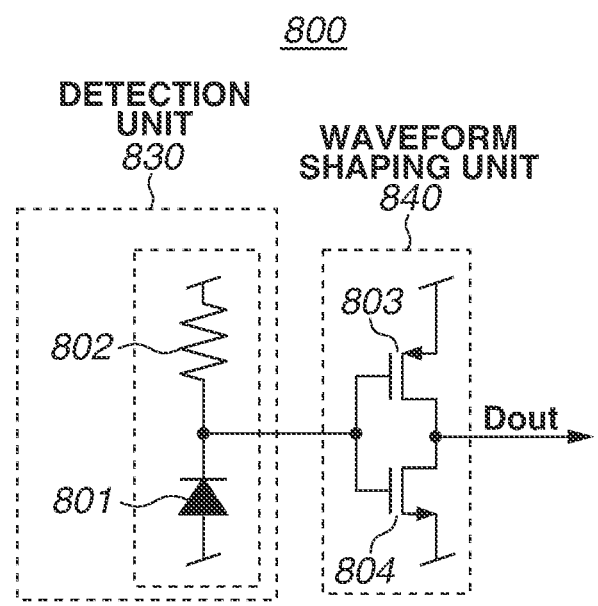
FIGS. 12A and 12B are a diagram illustrating an equivalent circuit of a monitor pixel and a diagram illustrating an operation of the electron beam detection element, respectively.

FIG. 12A is a diagram illustrating an equivalent circuit of the monitor pixel 800 in the fifth exemplary embodiment. A detection unit 830 differs from the detection unit 230 in the first exemplary embodiment in that the MOS transistor 201 is omitted. A waveform shaping unit 840 has the same configuration as that of the waveform shaping unit 240 in the first exemplary embodiment. The monitor pixel 800 is configured not to have a memory unit 250, which is provided in the pixel 200 in the first exemplary embodiment. A signal Dout, which is a signal output from the waveform shaping unit 840, is output to the element control unit 2006. In response to a change of signal level of the signal Dout, the element control unit 2006 outputs a control signal for changing the signal level of the signal Pact to the vertical scanning unit 102.

Figure 12B:
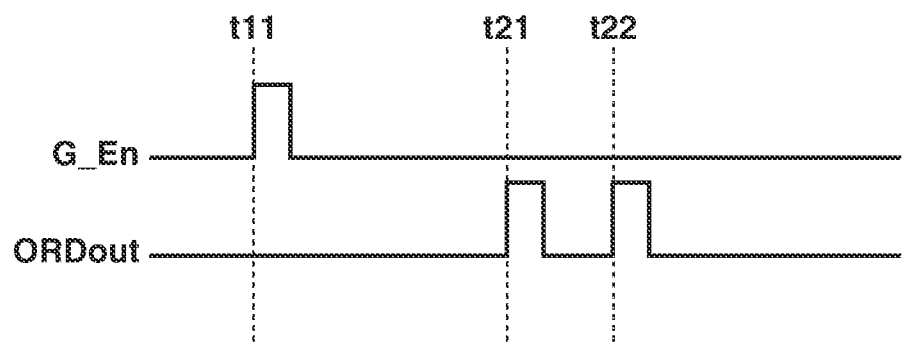

FIG. 12B is a diagram illustrating a signal ORDout, which is a signal output of the OR circuit 2010 illustrated in FIG. 11, and a control signal G_En.

In response to the signal G_En changing from L level to H level at time t11, the electron gun 1002 enters an inactive state. After that, in response to the signal ORDout changing from L level to H level at time t21, the element control unit 2006 detects that the electron beam detection element 1100 is being irradiated with an electron beam. At time t21 and later, the element control unit 2006 outputs a control signal for changing the signal level of the signal Pact to the vertical scanning unit 102. With this, the diode 202 of the pixel 200 transitions from an inactive state to an active state.

Furthermore, here, in response to the signal ORDout changing at time t21, the diode 202 of the pixel 200 is changed from an inactive state to an active state. For another example, in response to the signal ORDout changing at time t21 and the signal ORDout further changing at time t22, the diode 202 of the pixel 200 can be changed from an inactive state to an active state. In this case, the pixel 800 is configured to include a counter for counting pulses of the signal ORDout. When the output of the counter exceeds a predetermined count value, the diode 202 of the pixel 200 is caused to transition from an inactive state to an active state. Suppose a case where a change of signal level of the signal ORDout at time t21 may be caused not by irradiation of an electron beam but by false detection due to noise. In this case, if the diode 202 of the pixel 200 is caused to transition from an inactive state to an active state in response to a change of a signal level at time t21, the diode 202 enters an active state in a period in which an electron beam is not radiated from the electron gun 1002. In this case, the diode 202 would consume unnecessary power.

On the other hand, in a case where a configuration in which, when the number of times of a change of a signal level of the signal ORDout exceeds a predetermined number of times, the diode 202 is caused to transition from an inactive state to an active state, the above-mentioned state change of the diode 202 caused by false detection is unlikely to occur. This enables performing operation control of the diode 202 with the state of the electron gun 1002 being detected with a high degree of accuracy.

An electron microscope and an electron beam detection element according to a sixth exemplary embodiment are described focusing mainly on differences from the first exemplary embodiment.

The electron microscope according to the sixth exemplary embodiment includes an electron beam scanning unit which performs scanning of an electron beam which the electron gun 1002 outputs. Typically, the electron microscope according to the sixth exemplary embodiment can be applied as a scanning electron microscope (SEM) and a scanning transmission electron microscope (STEM).

The configuration of the electron beam detection element according to the sixth exemplary embodiment can be configured to correspond to the electron beam detection element 1100 described in the first exemplary embodiment with reference to FIG. 2. Furthermore, in the first exemplary embodiment, each of the signal Pact and the signal Pres is a signal which is output in common with respect to pixels 200 of all of the rows. In the sixth exemplary embodiment, each of the signal Pact and the signal Pres is a signal which is output in sequence for each row. To clarify which row each of the signal Pact and the signal Pres is associated with, the row number is appended to the end of each signal name for purposes of illustration.

Figure 13:
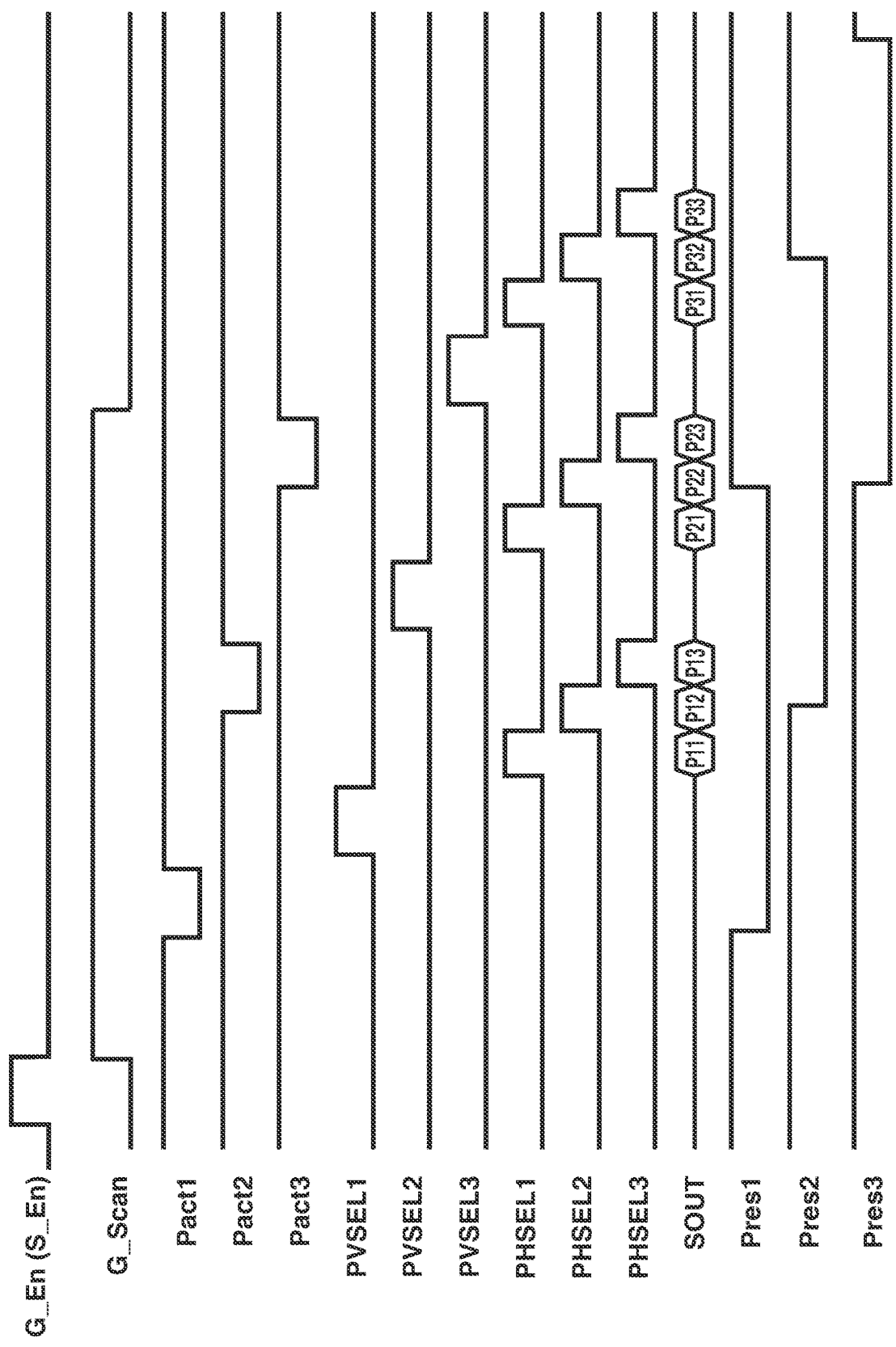
FIG. 13 is a diagram illustrating an operation of the electron beam detection element.

FIG. 13 is a diagram illustrating operations of the electron microscope and the electron beam detection element 1100 according to the sixth exemplary embodiment. A signal G_Scan is a control signal which the image processing device 1018 outputs to the electron beam scanning unit included in the electron microscope. During a period in which the signal G_Scan is at H level, the electron beam scanning unit performs scanning of an electron beam.

After the signal G_En changes to H level, the signal G_Scan changes to H level. With this, scanning of an electron beam by the electron beam scanning unit is performed.

After a predetermined period Ton elapses from the time when the signal G_En changes to H level, the element control unit 106 of the electron beam detection element 1100 changes a signal Pact1, which is output to pixels in the first row, which is a pixel row first scanned with an electron beam, from H level to L level. With this, the diodes 202 of the pixels 200 in the first row enter an active state.

After that, the element control unit 106 sequentially renders signals PHSEL1 to PHSEL3 at H level, and then reads out signals INVout of the respective pixels 200 indicated by addresses of P11, P12, and P13. Then, according to timing at which the electron beam scanning unit scans pixels 200 in the second row, the element control unit 106 renders a signal Pact2, which is output to the pixels 200 in the second row, from H level to L level. With this, the diodes 202 of the pixels 200 in the second row enter an active state.

In this way, according to the positions of scanning of an electron beam by the electron beam scanning unit, the electron beam detection element according to the sixth exemplary embodiment causes the diodes 200 of the pixels corresponding to those positions to transition from an inactive state to an active state. In the first exemplary embodiment, all of the pixels 200 are collectively caused to transition from an inactive state to an active state. Therefore, the lower the order is in which a pixel 200 is scanned with an electron beam, the longer a period from when the diode 202 of the pixel 200 transitions to an active state to when an electron beam actually falls on the diode 202 thereof becomes. Accordingly, the power consumption of the diode 202 increases.

On the other hand, the electron beam detection element according to the sixth exemplary embodiment sequentially brings the diodes 202 of the respective pixels 200 into an active state according to timing of scanning with an electron beam. This enables a further reduction in the consumption current as compared with the configuration described in the first exemplary embodiment.

The various embodiments are not limited to the above-described exemplary embodiments, but can be modified in various manners.

For example, an embodiment in which a partial configuration of any exemplary embodiment is added to another exemplary embodiment or is substituted by a partial configuration of another exemplary embodiment is also included in the various embodiments.

Moreover, the above-described exemplary embodiments merely represent examples of implementations, and should not be construed to limit the technical scope of all embodiments. In other words, various embodiments can be implemented in various fashions without departing from the technological thought thereof or main characteristics thereof.

According to exemplary embodiments, consumption current of a diode when an electron gun is in an inactive state can be reduced.

While the disclosure has described exemplary embodiments, it is to be understood that the claims are not limited to the disclosed exemplary embodiments. The scope of the following claims is to be accorded the broadest interpretation so as to encompass all such modifications and equivalent structures and functions.

This application claims priority to Japanese Patent Application No. 2017-214832, which was filed on Nov. 7, 2017 and which is hereby incorporated by reference herein in its entirety.

What is claimed is:

1. An electron beam detection element comprising:
    a diode being an avalanche diode, and configured to detect electrons generated by an electron beam radiated from an electron gun;
    a node to which a power-supply voltage is supplied;
    a quench resistor element connected to the diode and the node;
    a switch configured to control an electrical path between the node and the diode via the quench resistor; and
    a control unit configured to control the switch;
    wherein the control unit controls the switch into an off state when the diode is not irradiated with the electron beam and controls the switch into an on state when the diode is irradiated with the electron beam.

2. The electron beam detection element according to claim 1, wherein the control unit causes the diode to transition from an inactive state to an active state after a predetermined period elapses from a change from the diode not being irradiated with the electron beam to the diode being irradiated with the electron beam.

3. The electron beam detection element according to claim 2, wherein the predetermined period in a case where an accelerating voltage for the electron beam is set to a second voltage higher than a first voltage is shorter than the predetermined period in a case where the accelerating voltage for the electron beam is set to the first voltage.

4. The electron beam detection element according to claim 2, wherein the predetermined period is a period equal to or shorter than a period Tarv (sec) determined by the following formulae:

$$v = \sqrt{\frac{2qV}{m}},$$

where V is accelerating voltage (V), q is elementary charge (C), m is electron mass (kg), and v is velocity (m/sec), and $$Tarv = \frac{L}{v},$$

where L is distance (m) from the electron gun to the electron beam detection element.

5. The electron beam detection element according to claim 1,
    wherein the diode enters the inactive state in response to the switch taking the off state, and wherein the diode enters the active state in response to the switch taking the on state.

6. The electron beam detection element according to claim 1, further comprising a plurality of pixels, each of which includes the diode,
wherein scanning of the electron beam is performed in such a manner that the electrons are sequentially radiated on the plurality of pixels, and
wherein the control unit sequentially performs transition of the diode of each of the plurality of pixels from the inactive state to the active state in an order corresponding to the scanning.

7. The electron beam detection element according to claim 1, further comprising a plurality of pixels, each of which includes the diode,
wherein, after causing the diodes of some pixels of the plurality of pixels to transition from the inactive state to the active state, the control unit causes the diodes of the other pixels of the plurality of pixels to transition from the inactive state to the active state.

8. An electron beam detection element comprising:
a diode configured to detect electrons generated by an electron beam radiated from an electron gun;
a control unit configured to cause the diode to transition from an inactive state to an active state in response to a change of a signal level of a control signal for causing the electron gun to change from an inactive state to an active state; and
a plurality of pixels, each of which includes the diode;
wherein, during a period in which the diodes of some pixels of the plurality of pixels are in the inactive state, the control unit brings the diodes of the other pixels of the plurality of pixels into an active state, and
wherein the control unit causes the diodes of some pixels of the plurality of pixels to transition from the inactive state to the active state based on a change of outputs of the other pixels of the plurality of pixels.

9. The electron beam detection element according to claim 1, further comprising a plurality of pixels, each of which includes the diode,
wherein, during a period in which the diodes of some pixels of the plurality of pixels are in the inactive state, the control unit brings the diodes of the other pixels of the plurality of pixels into an active state, and
wherein the control unit causes the diodes of some pixels of the plurality of pixels to transition from the inactive state to the active state based on a change of outputs of the other pixels of the plurality of pixels.

10. The electron beam detection element according to claim 2, further comprising a plurality of pixels, each of which includes the diode,
wherein, during a period in which the diodes of some pixels of the plurality of pixels are in the inactive state, the control unit brings the diodes of the other pixels of the plurality of pixels into an active state, and
wherein the control unit causes the diodes of some pixels of the plurality of pixels to transition from the inactive state to the active state based on a change of outputs of the other pixels of the plurality of pixels.

11. The electron beam detection element according to claim 4, further comprising a plurality of pixels, each of which includes the diode,
wherein, during a period in which the diodes of some pixels of the plurality of pixels are in the inactive state, the control unit brings the diodes of the other pixels of the plurality of pixels into an active state, and
wherein the control unit causes the diodes of some pixels of the plurality of pixels to transition from the inactive state to the active state based on a change of outputs of the other pixels of the plurality of pixels.

12. The electron beam detection element according to claim 5, further comprising a plurality of pixels, each of which includes the diode,
wherein, during a period in which the diodes of some pixels of the plurality of pixels are in the inactive state, the control unit brings the diodes of the other pixels of the plurality of pixels into an active state, and
wherein the control unit causes the diodes of some pixels of the plurality of pixels to transition from the inactive state to the active state based on a change of outputs of the other pixels of the plurality of pixels.

13. An electron microscope comprising:
the electron beam detection element according to claim 1; and
the electron gun,
wherein the electron beam detection element receives secondary electrons from a specimen.

14. The electron microscope according to claim 13, further comprising a stage to which the electron beam is radiated,
wherein the stage is configured to cool the specimen.

15. A transmission electron microscope comprising:
the electron beam detection element according to claim 1; and
the electron gun,
wherein the electron beam detection element receives electrons having passed through a specimen.

16. The transmission electron microscope according to claim 15, further comprising a stage to which the electron beam is radiated,
wherein the stage is configured to cool the specimen.

17. An electron microscope comprising:
the electron beam detection element according to claim 8; and
the electron gun,
wherein the electron beam detection element receives secondary electrons from a specimen.

18. The electron microscope according to claim 17, further comprising a stage to which the electron beam is radiated,
wherein the stage is configured to cool the specimen.

19. A transmission electron microscope comprising:
the electron beam detection element according to claim 8; and
the electron gun,
wherein the electron beam detection element receives electrons having passed through a specimen.

20. The transmission electron microscope according to claim 19, further comprising a stage to which the electron beam is radiated,
wherein the stage is configured to cool the specimen.

* * * * *